United States Patent [19]

Seely et al.

[11] Patent Number: 5,410,743

[45] Date of Patent: Apr. 25, 1995

[54] ACTIVE IMAGE SEPARATION MIXER

[75] Inventors: Warren L. Seely, Chandler; Joseph Staudinger, Gilbert; John M. Golio, Chandler, all of Ariz.

[73] Assignee: Motorola, Inc., Schaumburg, Ill.

[21] Appl. No.: 75,621

[22] Filed: Jun. 14, 1993

[51] Int. Cl.$^6$ .............................................. H04B 1/26
[52] U.S. Cl. .................................... 455/326; 455/302;
455/333; 327/113
[58] Field of Search ............... 455/333, 323, 318, 319, 455/326, 209; 307/529

[56] References Cited

U.S. PATENT DOCUMENTS

| | | | |
|---|---|---|---|
| 3,575,660 | 4/1971 | Jorgensen | 325/388 |
| 3,757,258 | 9/1973 | Dillman et al. | 333/73 |
| 3,805,163 | 4/1974 | Hata et al. | 325/437 |
| 4,352,071 | 9/1982 | Childs et al. | 329/105 |
| 4,367,560 | 1/1983 | Hallford | 455/330 |
| 4,457,022 | 6/1984 | Dydyk | 455/317 |
| 4,584,715 | 4/1986 | Baars et al. | 455/302 |
| 4,662,001 | 4/1987 | Cruz et al. | 455/340 |
| 4,675,911 | 6/1987 | Sokolovo et al. | 455/325 |
| 4,696,055 | 9/1987 | Marshall | 455/118 |
| 4,723,317 | 2/1988 | Glance | 455/619 |
| 4,731,875 | 3/1988 | Mizukami et al. | 455/302 |
| 4,801,900 | 1/1989 | Mower | 332/45 |
| 4,893,098 | 1/1990 | Seely et al. | 333/112 |
| 4,896,374 | 1/1990 | Waugh et al. | 455/325 |
| 4,955,079 | 9/1990 | Connerney et al. | 455/325 |
| 4,992,761 | 2/1991 | Seely et al. | 333/118 |
| 5,006,811 | 4/1991 | Kruger | 329/354 |
| 5,060,298 | 10/1991 | Waugh et al. | 455/326 |
| 5,161,254 | 11/1992 | Braathen | 455/306 |
| 5,168,242 | 12/1992 | Willems et al. | 330/54 |
| 5,175,885 | 12/1992 | Lange et al. | 455/323 |
| 5,214,796 | 5/1993 | Gorrie et al. | 455/326 |
| 5,265,269 | 11/1993 | Staudinger et al. | 455/330 |

Primary Examiner—Curtis Kuntz
Assistant Examiner—Mary M. Lin
Attorney, Agent, or Firm—Robert M. Handy

[57] ABSTRACT

A mixer separates IF components IF1, IF2 of the same frequency which are images of different frequency RF signals RF1, RF2 beating with a given LO signal. The LO signal is applied to a FET active power divider and applied to the drains of a pair of balanced FET mixing elements. The FETs for the active power divider are built from the same device structure as the FETs for the mixing elements sharing drain nodes. The RF signals are passed through a quadrature phase shifter and applied to the gates of the FET mixing elements. The mixed signals appear at the drains of FET mixing elements are applied to opposing ports of a second quadrature hybrid at whose output ports the separated IF output signals IF1, IF2 appear.

25 Claims, 6 Drawing Sheets

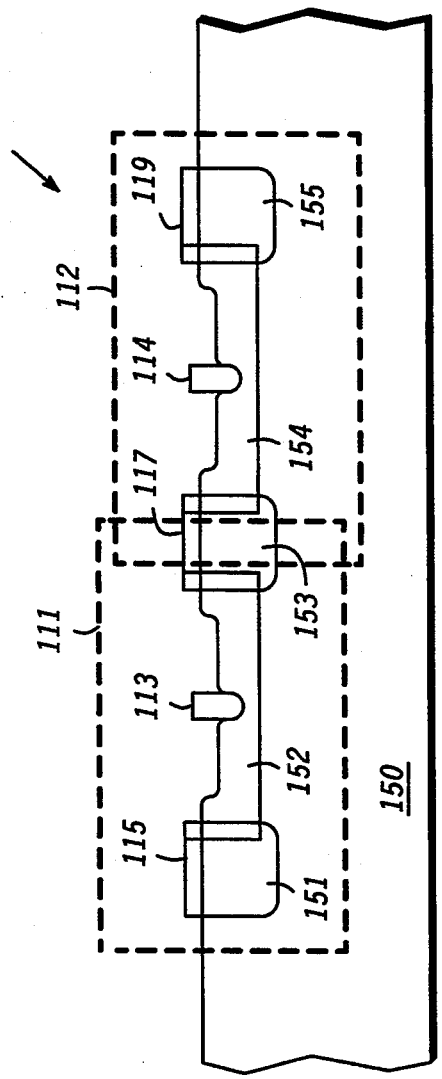
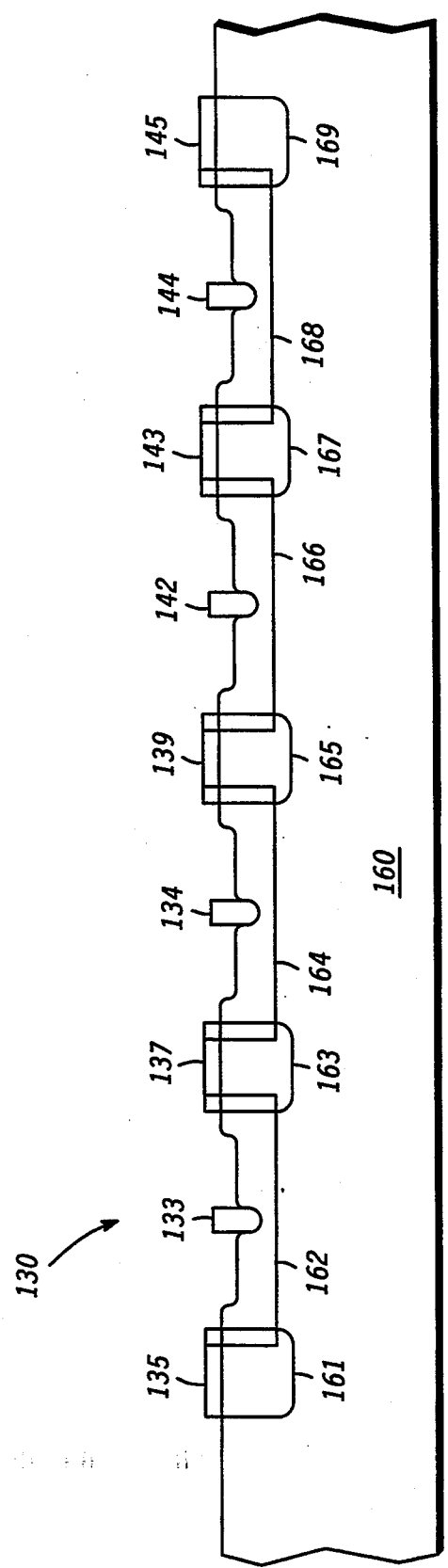

ACTIVE IMAGE SEPARATION MIXER

FIELD OF THE INVENTION

The present invention relates to electronic circuits known as mixers, and more particularly to image rejection and image enhancement mixers.

BACKGROUND OF THE INVENTION

It is commonplace in the electronic art to combine a modulated signal with a local oscillator signal in order to obtain a further modulated signal at another frequency that is more easily amplified and detected. This is done in a mixer.

In a typical application, a modulated radio frequency (RF) signal is combined in a mixer with a local oscillator (LO) signal to produce an intermediate frequency (IF) signal which may be then further amplified and detected to recover the information modulated onto the RF carrier. The mixing process produces sum and differences of the RF and LO frequencies. One or more of the sum and difference frequencies is at the desired IF frequency, according to the following relations:

$$f_{IF} = f_{LO} - f_{RF}, \text{ i.e., down-conversion where } f_{LO} > f_{RF}, \quad (1)$$

$$f_{IF} = f_{RF} - f_{LO}, \text{ i.e., down conversion where } f_{LO} < f_{RF}, \quad (2)$$

$$f_{IF} = f_{LO} + f_{RF}, \text{ i.e. up conversion.} \quad (3)$$

Examination of equations (1) and (2) shows that there is not a unique correspondence between $f_{LO}$, $f_{IF}$ and $f_{RF}$. For a given value of $f_{LO}$, two different values of $f_{RF}$ may produce the same value of $f_{IF}$. For example, (see FIG. 1) for $f_{LO}=3$ GigaHertz, both $f_{RF1}=2.5$ GigaHertz and $f_{RF2}=3.5$ GigaHertz can produce $f_{IF}=0.5$ GigaHertz. The RF and IF frequencies are generally not discrete frequencies but narrow bands of frequencies determined by the modulation thereon.

While the IF signals resulting from RF1 and RF2 have the same frequency, they may have different phase and carry different information. Thus, the IF signal may be thought of as having two components IF1, IF2 corresponding to two RF signals RF1, RF2, respectively. It is commonplace in the art to refer to one of the related signal pairs, e.g., RF1, IF1, as the "signal" and the other e.g., RF2, IF2, as the "image". The designations of RF1, IF1, as the "signal" and RF2, IF2 as the "image" are merely for convenience and may be interchanged. As used herein, the word "image" is intended to refer to IF1, IF2 collectively.

Mixers are often classified as "single balanced", "double balanced", "image rejection" and "image separation", depending upon their configuration and whether or not they separate the RF images at the IF output. Of particular interest are image separation mixers, that is, mixers that provide separate outputs for IF1 and IF2.

A prior art image separation mixer is illustrated in FIG. 2. Mixer 10 has input 12 where, for example, RF input signal 14 comprising either or both RF1 and RF2 enters. Quadrature phase shifter 16 splits incoming signal 14 into two substantially equal amplitude RF signals 18, 20 which have a relative phase displacement of 90°. Signal 18 is fed to three port mixer 19 and signal 20 is fed to three port mixer 21.

In FIG. 2 and subsequent figures, phase shifters are shown as a square with an inscribed diamond whose sides represent different paths between the ports of the phase shifter. The number adjacent each path identifies the relative phase shift along that path. For example, as signal 14 passes through the "0" path of phase shifter 16 to become signal 18 it undergoes a relative phase shift of 0° and as signal 14 passes through the "90" path of shifter 16 to become signal 20 it undergoes a relative phase shift of +90° with the result that signals 18 and 20 have a net or relative phase difference of 90°. Those of skill in the art will understand that the phase shift amounts indicated on the phase shift symbols are relative phase shift amounts and not absolute phase shift amounts. This same convention is used in connection with FIGS. 2–5. Where a four-port shifter is used, it is conventional to couple the "isolation" port, e.g., port 17, to ground via resistor 23 as shown in FIG. 2.

Mixer 10 has input port 22 where, for example, LO signal 24 is provided. Power splitter 26 receives signal 24 and produces two substantially equal amplitude zero relative phase difference signals 28, 30 respectively. In-phase LO signals 28, 30 are fed to mixers 19, 21 where they are mixed with RF signals 18, 20, respectively to produce IF signals 32, 33 at their outputs. Input signals 14 and 24 may be interchanged, that is, the RF signal may be introduced at input 22 and the LO signal may be introduced at input 12. The operation of the circuit is substantially the same.

Intermediate frequency signals 32, 33 from mixers 19, 21 are applied to quadrature phase shifter 34 where they combine in such a way that RF signals RF1, RF2 at input 12 (or 22) produce IF signals IF1, IF2 separated at outputs 36, 38 respectively. Separation of the RF1, RF2 signals into IF1, IF2 signals occurs because the relative phase $\phi$ of the signals is different according to the relations:

$$\phi_{IF1} = \phi_{LO} - \phi_{RF1}, \quad (4)$$

$$\phi_{IF2} = \phi_{RF2} - \phi_{LO}, \quad (4)$$

where $\phi_{RF}$ is the relative phase of the received signal at the RF frequency that may correspond to RF1 or RF2, $\phi_{LO}$ is the relative phase of the LO frequency, $\phi_{IF1}$ is the relative phase of the output at the IF frequency produced by signal RF1 below LO, and $\phi_{IF2}$ is the relative phase of the output at the IF frequency produced by signal RF2 above LO. Because of the phase relations of the intermediate IF signals 32, 33, at the IF1 output 36, the IF2 signal components are 180 degrees out of phase and cancel, while the IF1 signal components are in phase and thus combine or add. Likewise, at the IF2 output 38, the IF1 signal components are 180 degrees out of phase and cancel, while the IF2 signal components are in phase and thus combine or add. Thus this method of image separation and rejection is achieved by phase cancellations and additions, where the amount of image rejection is determined by the relative difference in IF1 and IF2 signal levels at either output port 36, 38. Equations (4)–(5) and the identification of the relative phase of the various signals are explained, for example, in B. J. Hallford, "Trace Phase States to Check Mixer Designs", *Microwaves*, Jun. 1980, pages 52–60.

FIG. 3 illustrates typical prior art three port mixer 40 used to provide mixers 19, 21 (FIG. 2). Mixer 40 has LO (or RF) input port 42 feeding into 180° phase shifter 44 with isolation port 45 used for IF extraction and RF (or LO) input port 46 feeding into 180° phase shifter 48 with isolation port resistive termination 47. The outputs from phase shifters 44, 48 are coupled to opposing ports of diode mixer ring 51. Mixers 19, 21 in prior art image separation mixer 10 (FIG. 2) each correspond to mixer 40 (FIG. 3).

Prior art image separation mixers have a number of disadvantages well known in the art. Among these are, for example, their relative complexity and the difficulty often encountered in implementation in compact form suitable for incorporation in monolithic microwave integrated circuits (MMIC's).

MMIC's are typically implemented using silicon, GaAs or other III–V integrated circuit (IC) wafer processing technology on and/or in such wafers. Thus, it is highly desirable to have image separation mixers which can be made with lumped elements or other structures that are compatible with IC fabrication techniques and geometry. In particular, it is important that they be of comparatively small in size so as to not occupy disproportionately large substrate areas compared to the semiconductor diodes, transistors, etc., which mix the signals, or compared to the amplifiers or other signal processing elements that may be included in the MMIC. Such concerns are especially important in the frequency range from about 1 to 15 GigaHertz where the size of distributed circuit elements is unwieldy.

Other disadvantages well know in the art are high conversion loss, poor isolation between the various ports and a high LO signal level requirement. Because the prior art image separation mixers typically use diodes as the non-linear elements, these mixers exhibit conversion loss in that the separated IF signals are smaller in amplitude than the received RF signals. Further, the use of diodes as the non-linear elements require a relatively large LO signal levels to drive the diodes in their normal operation. Another inherent limitation of prior art image rejection mixers is the limited signal isolation between the RF, LO and IF ports. Prior art schemes rely primarily on single phasing to achieve isolation.

Thus, there continues to be a need for improved image separation mixers which employ elements that result in a conversion gain rather than a conversion loss, which employ elements which permit a lower input LO signal level and improve the amount of isolation between the ports, and which at the same time can be implemented in MMIC form.

SUMMARY OF THE INVENTION

An advantage of the present invention is to provide an improved active image separation mixer and improved method of separating image signals comprising, in its broadest form a first phase shift circuit for receiving a first input signal of at least a first and second frequency, the first phase shift circuit providing first and second output signals of substantially equal amplitude and having a phase difference of substantially ninety degrees, a signal division and amplification circuit for receiving a second input signal of at least a third frequency, the signal division and amplification circuit providing third and fourth output signals of substantially equal amplitude and phase, the signal division and amplification circuit having first and second active amplification elements, a mixing circuit coupled between the first phase shift circuit and the signal division and amplification circuit, the mixing circuit for mixing the first and second output signals from the first phase shift circuit with the third and fourth output signals from the signal division and amplification circuit to provide fifth and sixth output signals of a fourth frequency derived from the first and second input signals, the mixing circuit having first and second active mixing elements, and a second phase shift circuit coupled to the mixing circuit for receiving the fifth and sixth output signals, the second phase shift circuit providing separated seventh and eighth output signals of the fourth frequency corresponding, respectively, to the first and second frequencies.

It is desirable but not essential that the first active mixing element and the first active amplification element comprise a first single device sharing a common node, the first single device having separate signal input nodes and separate reference nodes corresponding to the first active mixing element and the first active amplification element, respectively, and the second active mixing element and the second amplification element comprise a second single device sharing a common node, the second single device having separate signal input nodes and separate reference nodes corresponding to the second active mixing element and the second active amplification element, respectively.

The present invention further provides a method for mixing an RF input signal including first and second RF frequencies with a LO input signal to produce an output IF signal having a first and second separated components corresponding to the first and second RF frequencies, respectively, comprising coupling said RF input signal to a first phase shift circuit which provides first and second RF output signals, the RF output signals having substantially equal amplitude and differing in phase by substantially ninety degrees, coupling the LO input signal to a signal division and amplification circuit having first and second active amplification elements which provide first and second LO output signals, having substantially equal phase and amplitude, supplying the first RF output signal and the first LO output signal to a first active mixing element, supplying the second RF output signal and the second LO output signal to a second active mixing element, and coupling a first and second intermediate IF signal appearing at the first and second mixing elements to a second phase shift circuit, the second phase shift circuit providing substantially equal amplitude signal outputs differing in phase by ninety degrees, thereby obtaining the separated first and second separated components of the output IF signals corresponding to the first and second RF frequencies, respectively.

The foregoing method and apparatus provides an improved
  active image separation mixer having increased image rejection, less conversion loss or conversion gain, increased isolation between signal ports and requiring less
  components than prior art image rejection mixers.

BRIEF DESCRIPTION OF THE DRAWINGS

FIG. 7 is a typical cross sectional representation of the two monolithic field effect transistors from FIG. 6;

FIG. 9 is a typical cross sectional representation of the two monolithic field effect transistors from FIG. 8.

DETAILED DESCRIPTION OF THE DRAWINGS

Figure 4:
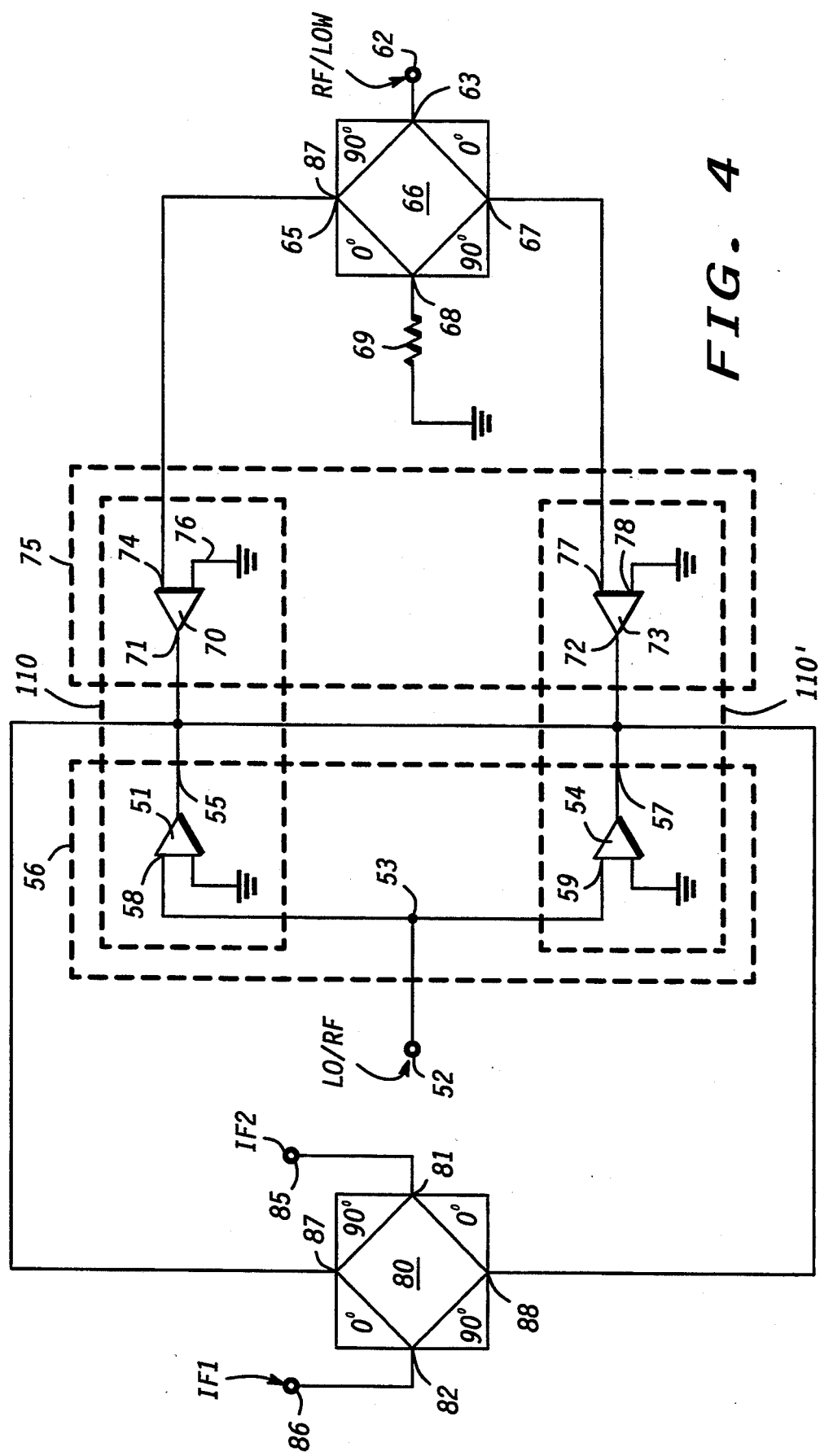
FIG. 4 is a simplified schematic representation of an active image separation mixer apparatus, according to a preferred embodiment of the present invention.

FIG. 4, illustrates an active image separation mixer apparatus 50, according to a preferred embodiment of the present invention. Mixer 50 has LO (or RF) signal input port 52 and RF (or LO) signal input port 62. For convenience of explanation, the circuit is described for the preferred case of port 52 receiving the LO signal and port 62 receiving the RF signal, but the signals may be interchanged and the apparatus will function in substantially the same way.

LO signal at input port 52 is coupled to port 53 of signal division and amplification circuit 56 which provides substantially equal amplitude and phase output LO signals at nodes 55, 57. The signal division and amplification circuit 56 can be any element or combination of elements that provide substantially equal amplitude and phase output signals and desirably is an active power divider with active amplification elements 51, 54. The precise manner of dividing and amplifying the LO signal is unimportant for the purposes of the present invention. The active amplification elements 51, 54 are desirably substantially identical transistors. Field effect transistors are suitable although other types of active elements or combinations of elements that provide signal amplification may be used for the active amplification elements 51, 54. In a preferred embodiment, the active amplification elements 51, 54 are matched field effect transistors from the same semiconductor die or die lot.

The RF signal at input port 62 is coupled to input port 63 of phase shift circuit 66 which provides substantially equal amplitude output RF signals at nodes 65, 67 differing in phase by substantially ninety degrees. The precise manner of phase shifting the RF signal is unimportant for the purposes of the present invention. Where phase shift circuit 66 is a four port element, then isolation port 68 is conveniently tied to ground via impedance 69, e.g., a resistive element.

Output signal pairs from phase shift circuit 66 at nodes 65, 67 are coupled to nodes 74, 77 of mixing elements 70, 73, and output signal pairs from the signal division and amplification circuit 56 at nodes 55, 57 are coupled to nodes 71, 72 of mixing elements 70, 73 respectively. Mixing elements 70, 73 can be any non-linear device or linear device operated in a non-linear mode. Mixing elements 70, 73 are desirably identical balanced transistors operated in a non-linear mode. Although other types of non-linear elements, non-linear operated elements or combinations of elements may be used for the active mixing elements 70, 73, field effect transistors (FETs) are desirable. In a preferred embodiment the active mixing elements 70, 73 are matched field effect transistors. When FETs are used as the active mixing elements 70, 73, metal semiconductor field effect transistors (MESFETs) are desirable. It is preferred that the matched pair of FETs used as the active mixing elements 70, 73 be from the same semiconductor die or die lot. If FETs are used as mixing elements 70, 73, nodes 71, 72 are output (e.g. drain) nodes nodes 74, 77 are input (e.g. gate) nodes, and nodes 76, 78 are reference (e.g. source) nodes, respectively.

In another preferred embodiment, active mixing element 70 and active amplification element 51 are part of the single device structure 110, and active mixing element 71 and active amplification element 54 are part of another substantially identical single device structure 110'. Active mixing element 70 and the active amplification element 51 share an output node as part of device structure 110, and active mixing element 73 and active amplification element 54 share an output node as part of device structure 110'. Where active mixing element 70 and active active amplification element 51 are FETs, drain nodes are shared, and likewise where active mixing element 73 and active amplification elements 54 are FETs, drain nodes are also shared. It is desirable that the single device structures 110, 110' are mirror images of each other and fabricated on the same semiconductor die.

Due to the non-linear conduction properties of the active mixing elements 70, 73, the RF and LO signals are mixed and the resulting IF signals appear at nodes 71, 72 of mixing elements 70, 73. IF signals are coupled from nodes 71, 72 to input nodes 87, 88 respectively, of second phase shift circuit 80. Second phase shift circuit 80 has output nodes 81, 82 at which appear output signals at the IF frequency which have undergone a relative phase shift with respect to the IF signals arriving at input ports 87, 88, according to the relative phase shift amounts ("0", "90") shown within phase shifter 80, as has been previously explained. The precise manner of phase shifting and combining the IF signals in phase shifter 80 is unimportant for the purposes of the present invention.

Output IF signals at nodes 81, 82 are coupled to output nodes 85, 86 of mixer apparatus 50. Output IF signals correspond to separated IF signals IF1 and IF2 derived from input RF signals RF1 and RF2, respectively. That is, substantially all of signal IF1 appears at nodes 82, 86 and substantially all of signal IF2 appears at ports 81, 85.

How this is accomplished may be better understood by reference to Phase Analysis Table I below which shows the relative phase of the various signals within mixing apparatus 50, according to equations (4)–(5) and the convention of Hallford, supra.

TABLE I

| | PHASE ANALYSIS | | | | |
|---|---|---|---|---|---|
| REF. NODE/PORT | 71 | 72 | 74 | 77 | 53 |
| $\phi_{LO}$ | 0 | 0 | N/A | N/A | 0 |
| $\phi_{RF}$ | +90 | 0 | +90 | 0 | N/A |
| $\phi_{IF1}$ | −90 | 0 | N/A | N/A | N/A |
| $\Delta\phi_{IF2}$ | +90 | 0 | N/A | N/A | N/A |

Figure 1:
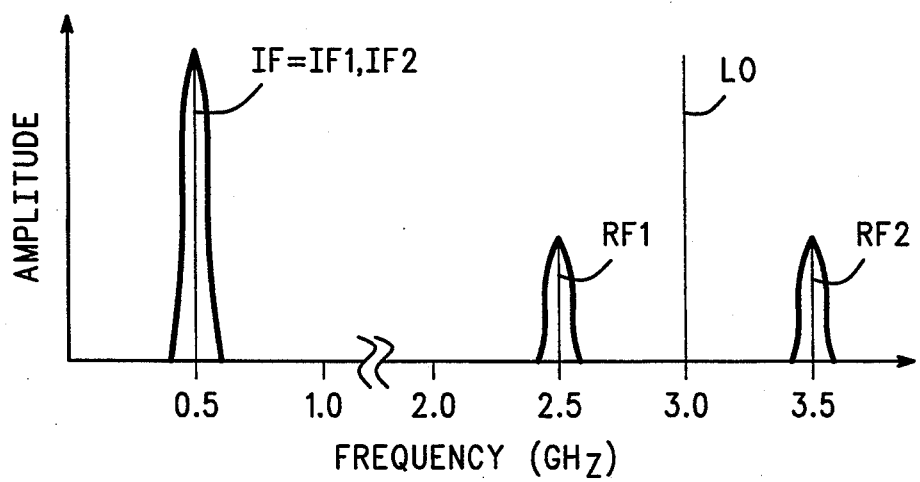
FIG. 1 is a simplified representation of RF, LO and IF signals of different frequencies showing how RF signals RF1, RF2 produce images IF1, IF2.
Figure 2:
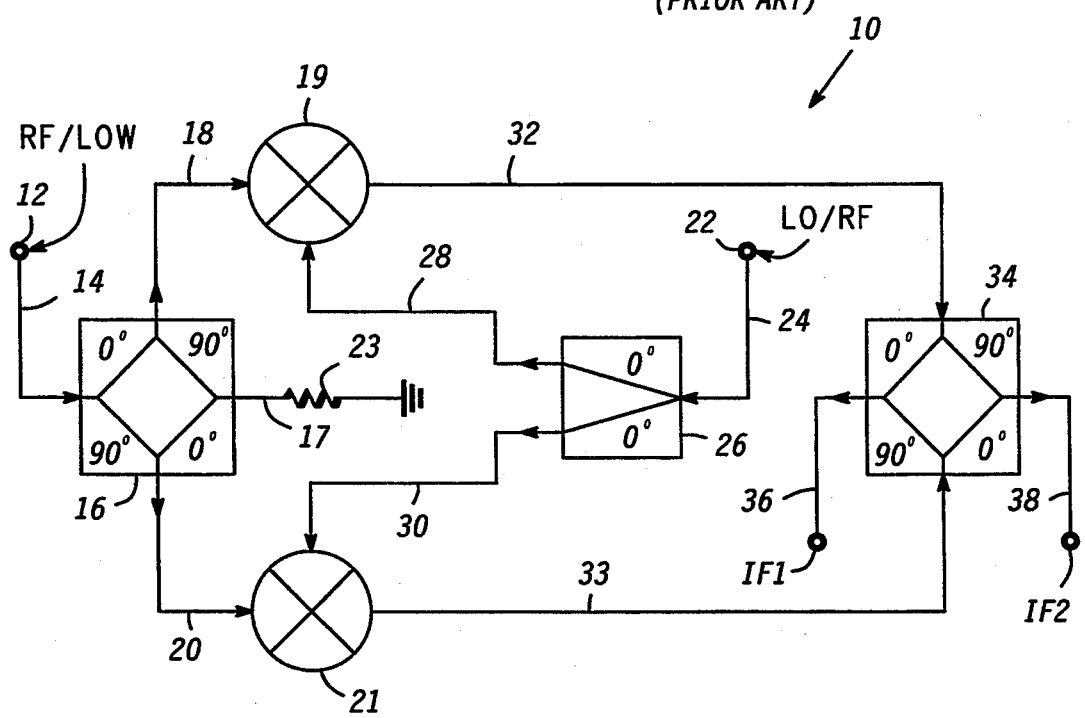
FIG. 2 is a simplified schematic representation of an image separations mixer apparatus, according to the prior art.
Figure 3:
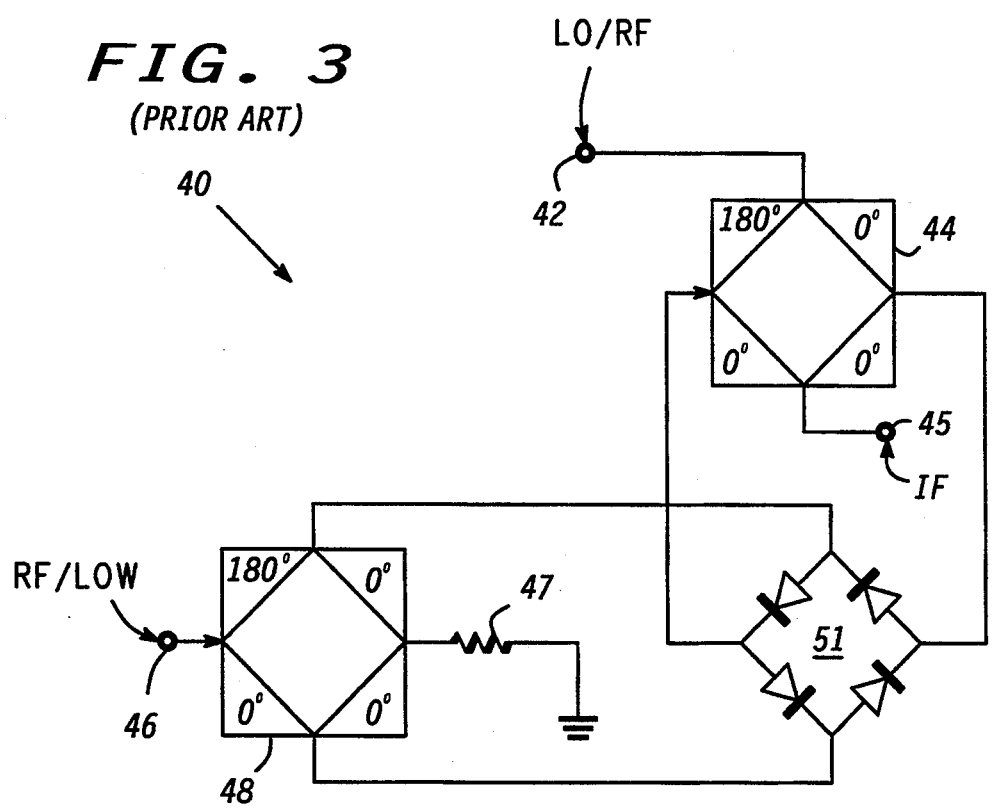
FIG. 3 a simplified schematic representation of a mixer element used in the circuit of FIG. 2, according to the prior art.

IF signals appearing at ports 71, 72 each have IF1, IF2 components having the relative phase indicated in Table I. When IF signals appearing at ports 71, 72 are passed through second phase shifter 80, the various IF1, IF2 components add to reinforce or cancel according to the total relative phase difference that has been created in mixer 50. When IF1, IF2 are combined in phase shifter 80, all of the IF1 signals are out of phase at port 81 (cumulative $\Delta\phi=180°$) and in phase at port 82 (cumulative $\Delta\phi=0°$), and conversely for IF2 signals. Thus, separation of the IF1, IF2 signals is achieved. Further, such separation is achieved using only two active mixing elements 70, 73 and two active amplification elements 51, 54, and substantially fewer overall components as compared, for example to the prior art arrangements of FIGS. 2–3. Further, conversion efficiency is enhanced through the use of active mixer elements 70, 73 because the active mixer elements have gain at the RF frequencies, and less LO power is required through the use of active amplification elements 51, 54 which amplify the LO signal.

Further, when monolithic transistors (e.g. FETs fabricated in a MMIC die) are used for both active amplification elements 51, 54 and active mixing elements 70, 73, and when combined into respective single device structures 110, 110' where output (e.g drain) nodes are shared, there is no requirement for impedance matching between the active mixing elements 70, 73 and the active amplification elements 51, 54. This significantly reduces the circuit area required for implementation and makes it easier to fabricate the mixer in an integrated circuit and/or monolithic form.

The use of active elements such as transistors as both the active amplification elements 51, 54 and the active mixing elements 70, 73 also provide for improved signal isolation between the RF, LO and IF ports. LO to RF isolation is determined in part by the equal amplitude and ninety degree phase differential of the signal components, the reverse isolation of active mixing elements 70, 73 and the reverse isolation of active amplification elements 51, 54. When both the active amplification elements 51, 54 and the active mixing elements 70, 73 are FETs, LO to RF isolation is further improved because of the excellent reverse isolation characteristics of FETs.

Further, strip line or other large area components need not be used (although they are not precluded) and most or all of the various elements can be implemented as relatively compact lumped elements compatible with MMIC's.

Figure 5:
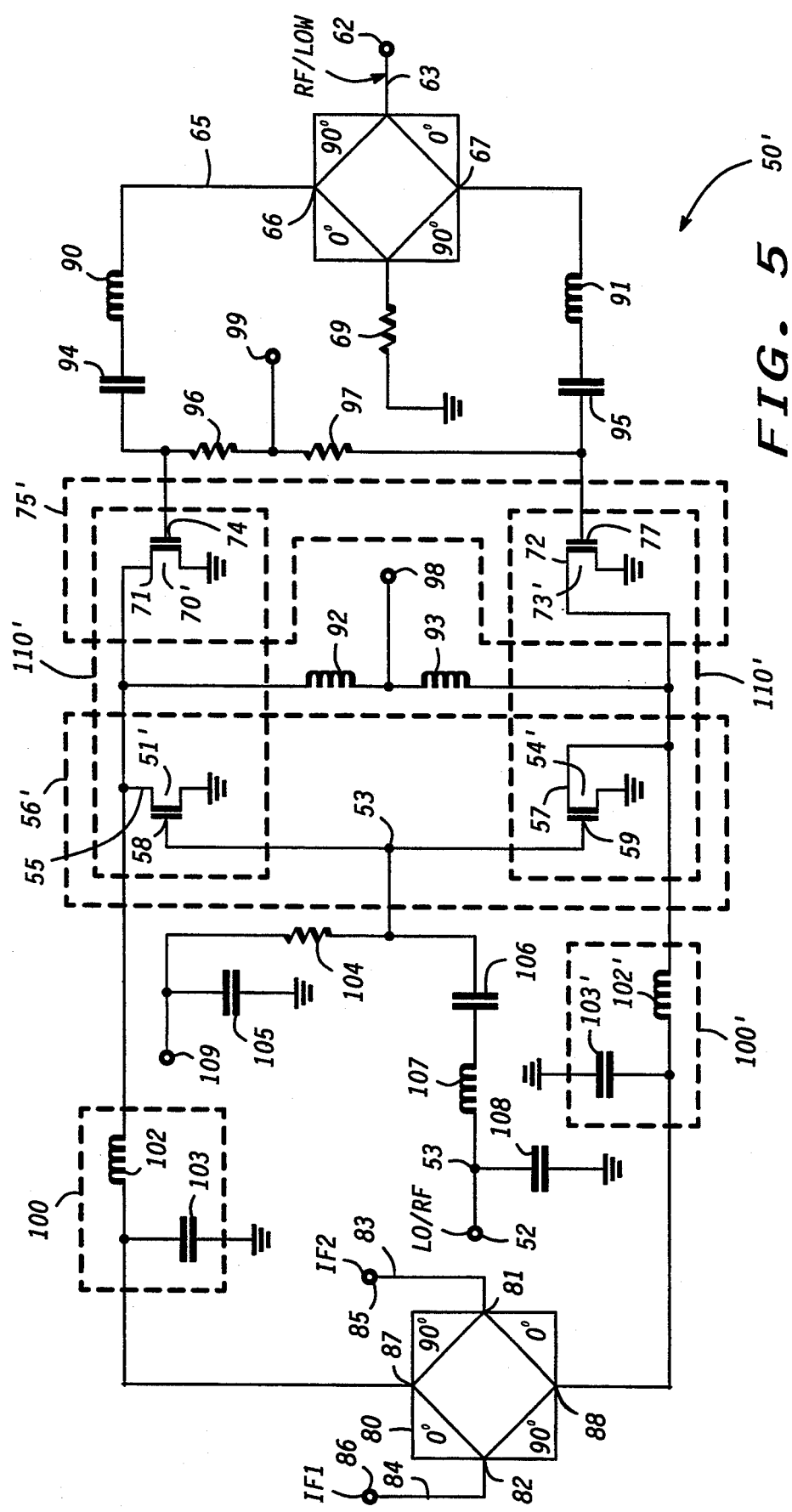
FIG. 5 is a schematic representation of the active image separation mixer apparatus of FIG. 4 in greater detail.

FIG. 5 shows apparatus 50' analogous to apparatus 50 of FIG. 4, but in more detail. Similar elements are marked with the same reference numbers.

Circuit 50' comprises phase shift circuit 66 and 80, an active power divider 56' comprised of FETs 51', 54' for the active amplification elements 51, 54 (FIG. 4) of the signal division and amplification circuit 56, and mixing circuit 75' comprised of FETs 70', 73', for active mixing elements 70, 73 (FIG. 4). While use of an active power divider 56' comprising FETs 51', 54' is convenient, other signal division and amplification techniques and other types of amplifying elements may also be used. Circuit 50' functions in the same manner as described for circuit 50 of FIG. 4, but with the addition of further elements that provide for DC blocking, DC return, DC bias and improved high frequency impedance matching and filtering.

Inductances 90, 91 are coupled in the signal lines leading from phase shift circuit 66 to mixer element nodes 74, 77 respectively, to enhance impedance matching to mixer elements 70, 73 (FIG. 4). Capacitances 94, 95 are desirably provided for DC isolation of mixing elements 70, 73 (FIG. 4) from phase shift circuit 66. Inductances 92, 93 provide a high AC and low DC impedance between mixer elements 70, 73 (FIG. 4) for connection to the supply voltage at node 98. Resistive elements 96, 97 provide for setting the operating point for the mixing elements 70, 73 by connection to bias node 99. Where mixing elements 70, 73 (FIG. 4) are FETs 70',73' (FIG. 5), node 99 would provide a gate bias voltage while node 98 would provide a drain supply voltage for FETs 70', 73'.

Those of skill in the art will understand based on the description herein how to choose whether some or all of elements 90–97 are needed and the appropriate component values depending upon the particular RF, LO and IF frequencies and the choice of mixing and phase shifting elements intended to be used.

Impedances 106, 107 and 108 are chosen to match the LO frequency component to the input ports of the active amplification elements 51, 54 (FIG. 4) of the signal division and amplification circuit 56. When FETs 51', 54' (FIG. 5) are used for the active amplification elements 51, 54 (FIG. 4) in an active power divider configuration 56', impedances 106, 107 and 108 are chosen to maximize the drain to source voltage levels of FETs 51' and 54'. Hence the FETs 51', 54' operate as amplifiers with large drain to source voltages. It is desirable that active power divider circuit 56' has substantially identical phase and amplitude output characteristics for the LO frequencies being coupled to the mixer elements 70, 73 (FIG. 4) so that minimum phase shift is introduced thereby. It is preferable that FETs 51' and 54' (FIG. 5) be as closely matched as possible.

Impedance elements 104 and 105 provide a DC path for setting the operating point for active amplification elements 51, 54 (FIG. 4), while preferably isolating the LO signals from the bias voltage at node 109. The supply voltage is provided at node 98 through inductances 92, 93 as previously discussed for the active mixing elements 70, 73. When active amplification elements 51, 54 are FETs 51', 54', node 109 would provide a gate bias voltage and node 98 would provide a drain supply voltage.

Filters 100, 100' having pass bands at the IF frequency and stop bands at the RF and/or LO frequencies allow extraction of IF signals without disrupting phase or amplitude balance of the signal components present in the mixing elements. Filters 100, 100' provide isolation of the RF and IF signals, and isolation of the LO and IF signals. Filters 100, 100' are desirably provided between active mixer elements 70, 73 (FIG. 4) and the second phase shift circuit 80. A simple but effective filter comprises series inductor 102, 102' and shunt capacitor 103, 103', but other filter arrangements well known in the art may also be used. It is important that filters 100, 100' have the same net phase shift for the IF frequencies being coupled from active mixer elements 70, 73 to phase shift circuit 80 so that minimal relative phase shift is introduced thereby. Filters 100, 100' are desirably substantially identical and may be mirror images of each other.

Figure 6:
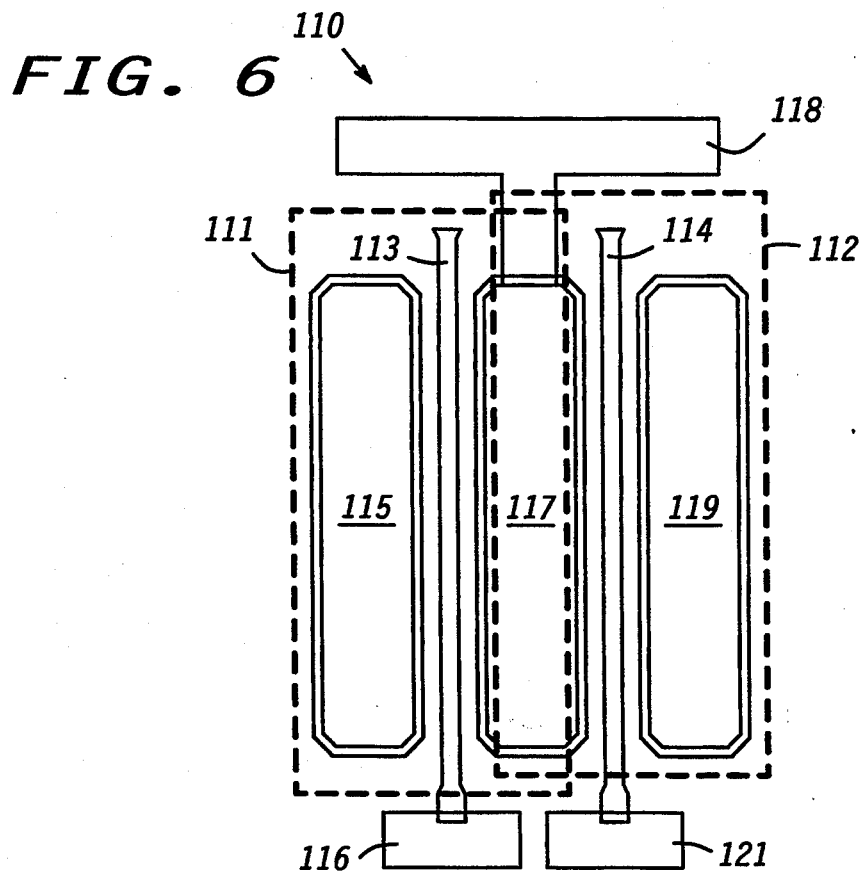
FIG. 6 is a simplified plan view representation of two monolithic field effect transistors of a single device structure that share a drain node suitable for use in a preferred embodiment of the present invention.

FIG. 6 shows a simplified plan view representation of two field effect transistors of a single device structure 110 that share drain region-117 suitable for use in a preferred embodiment of the present invention. Source region 115, gate region 113 and drain region 117 comprise a first FET 111 while source region 119, gate region 114 and drain region 117 comprise a second FET 112, with both FETs sharing the the same drain region 117. In a preferred embodiment FET 111 would represent active mixing element 70, 70′ or 73, 73′ (FIGS. 4–5) and FET 112 would represent active amplification element 51, 51′ or 54, 54′ (FIG. 4–5) respectively. Those of skill in the art will understand how to select the ratio of the size of FETS 111, 112 (e.g. gate width for example) based on the desired image rejection and impedances needed for the particular application, according to procedures well known in the art. Single device structure 110 is not shown with any connection between source regions 115, 119 for clarity, but source regions 115, 119 are desirably connected together and to ground. In typical monolithic construction sources 115, 119 would be connected together according to procedures well known in the art. Aside from the use of a common drain region or equivalent common region for other types of transistors, the precise details of monolithic construction are not important to the present invention. Single device structures 110 and 110′ (FIGS. 4–5) are substantially identical except that 110′ is preferably a mirror image of single device structure 110.

FIG. 7 is a typical cross sectional representation of the two monolithic field effect transistors from FIG. 6. Similar elements are marked with the same reference numbers. In a preferred embodiment, region 150 represents semiconductor material such as GaAs, and regions 151–155 represent regions with predetermined carrier concentrations, i.e., doping. For example, regions 151, 153, 155 may be doped N+ while regions 152, 154 may be doped N— Single doped region 153 serves as common drain region 117 (FIG. 6). While FIG. 7 shows a typical FET cross section, the precise construction or type of FET (e.g. MESFET) is not important to the present invention. Any type of FET is suitable for use in the present invention. Those of skill in the art will understand how to choose the semiconductor construction for desired characteristics of the present invention.

Figure 8:
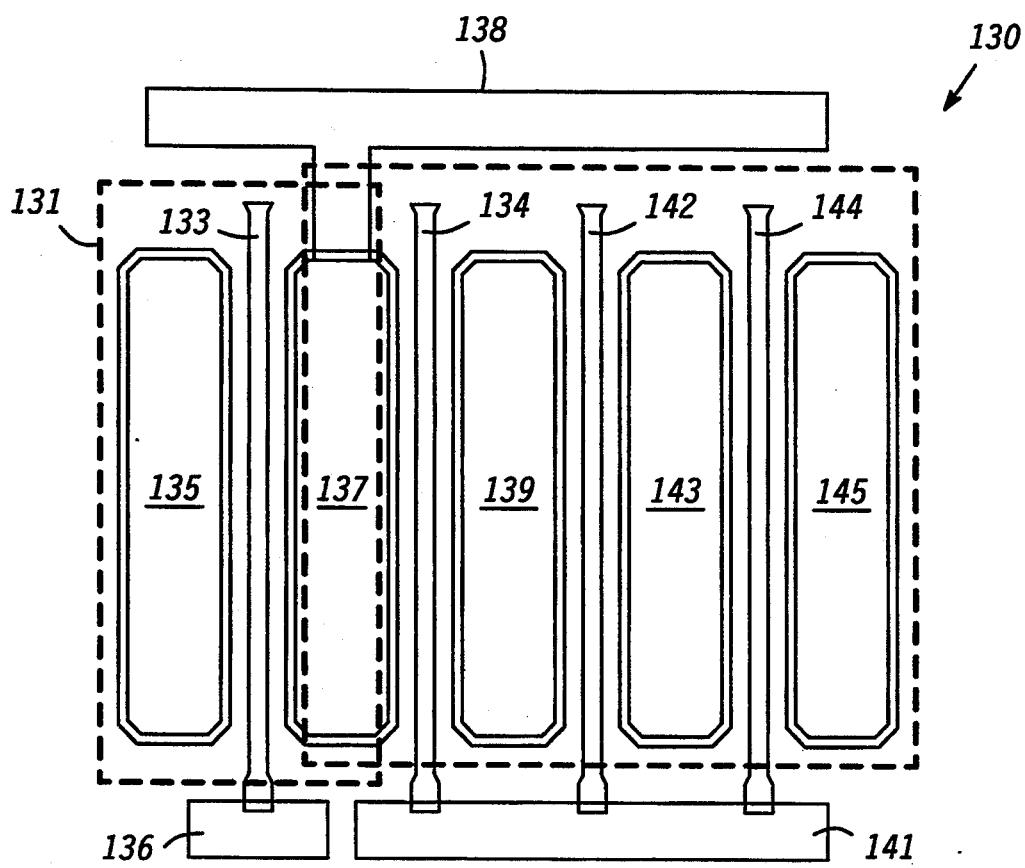
FIG. 8 is a simplified plan view representation of two monolithic field effect transistors with different gate widths of a single device structure that share a drain node suitable for use in a preferred embodiment of the present invention.

FIG. 8 is a simplified plan view representation of two monolithic field effect transistors 131, 133 with different gate widths of a single device structure 130 that share a drain 137 suitable for use in a preferred embodiment of the present invention. Source region 135, gate region 133 and drain region 137 comprise a first FET 131 while source regions 139, 145, gate regions 134, 142, 144 and drain regions 137, 143 comprise a second FET 132, with both FETs sharing the the same drain region 137. Drain regions 137, 43 are connected together by a common drain node 138 for both FETs 131, 132. Gate regions 134, 142, 144 are connected together to form a gate node 141 for FET 132. Gate region 133 is connected to gate node 136 for FET 131. In a preferred embodiment FET 131 would represent active mixing element 70, 70′ or 73, 73′ (FIGS. 4–5) and FET 132 would represent active amplification element 51, 51′ or 54, 54′ (FIG. 4–5) respectively. Common drain node 138 would represent nodes 55, 71 (FIGS. 4–5) of device structure 110 (FIG. 4–5) or nodes 57, 72 (FIGS. 4–5) of device structure 110′ (FIG. 4–5). Gate node 136 would represent node 74 (FIGS. 4–5) of device structure 110 (FIG. 4–5) or node 77 (FIGS. 4–5) of device structure 110′ (FIG. 4–5). Gate node 141 would represent node 53 (FIGS. 4–5). FET 132 is shown with a gate width three times that of FET 131 but other ratios of FET size are suitable for the present invention. In general, it is desirable that the transconductance of the amplifier element 51, 54 (FIG. 4) be one to five times the transconductance of the mixing element 70, 73 (FIG. 4) with a ratio of one and a-half to four being convenient and with a ratio of two being preferred. Those of skill in the art will understand how to select and set the ratio of the size of FETs 131, 132 (e.g. gate width or transconductance) based on the desired image rejection and impedances needed for the particular application, according to procedures well known in the art. Single device structure 130 is not shown with any connection between sources 135, 139, 145 for clarity, but sources 135, 139, 145 are desirably connected together and to ground or some other reference potential. In typical monolithic construction sources 135, 139, 145 would be connected together according to procedures well know in the art. The precise details of the monolithic construction are not important to the present invention provided that shared output regions of the devices exist. Single device structures 130, would correspond to single device structure 110 (FIGS. 4–5), while single device structure 110′ (FIGS. 4–5) would be substantially identical to single device structure 130 except that 110′ is preferably a mirror image of single device structure 110.

FIG. 9 is a typical cross sectional representation of the two monolithic field effect transistors from FIG. 8. Similar elements are marked with the same reference numbers. In a preferred embodiment, region 160 would represent semiconductor material such as GaAs, and regions 161–169 would represent regions with predetermined carrier concentrations (e.g. doping). For example, regions 161, 163, 165, 167, 169 may be doped N+ while regions 162, 164, 166, 168 may be doped N—. While FIG. 9 shows a typical FET cross section, the precise details of the construction or type of FET (e.g. MESFET) are not important to the present invention provided that shared output regions of the devices exist. Those of skill in the art will understand that while devices 110 (FIG. 6–7) and 130 (FIG. 8–9) are shown as being MESFETs with common drain regions, MOSFETs with common drain regions or bipolar transistors with common collector regions, as well as other active devices could also be used. Those of skill in the art will understand how to choose the semiconductor construction for desired characteristics.

Figure 10:
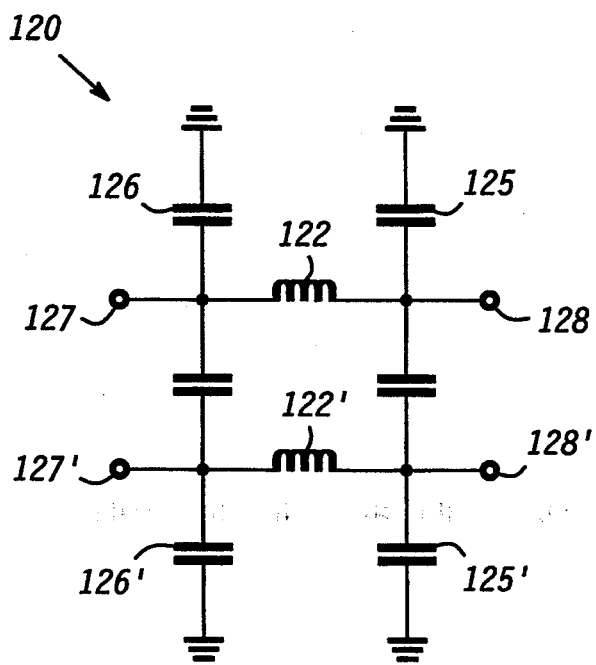
FIG. 10 is simplified schematic representation of a ninety degree phase shift circuit suitable for use in the present invention.

FIG. 10 shows a simplified schematic of a four port quadrature phase shifting circuit suitable for use in the present invention. Such phase shifters are described in more detail in U.S. Pat. Nos. 4,992,761 and 4,893,098 by the same assignee.

FIG. 10, depicts ninety degree relative phase shifter 120 having inductors 122, 122′ and capacitors 123, 124, 125, 125′, 126, 126′ connected as shown and coupled to inputs (or outputs) 127, 127′ and outputs (or inputs) 128, 128′ Those of skill in the art will understand how to select the magnitude of components 122–126 based on the desired frequency response and impedances needed for the particular application, according to procedures well known in the art.

Inductors, capacitors and resistors such as are illustrated in FIGS. 4–6 may be readily fabricated using IC process techniques in a manner compatible with MMIC's. For example, resistors are formed from polycrystalline or single crystal semiconductor regions of various doping or using thin film materials, as for example, NiCr, TiW, TaN, and the like. Capacitors are formed using metal layers or semiconductor layers or a combination thereof spaced apart by dielectrics otherwise available during IC fabrication, as for example, SiO, SiO$_2$, Si$_3$N$_4$ or combinations thereof. Inductors are formed using metal regions of spiral shape and/or other geometries well known in the art. Al, Au and TiW are non-limiting examples of metals commonly used for conductors in IC's. Techniques for fabricating such conductor, resistor, capacitor and/or inductor elements using the same techniques employed in IC fabrication are well known in the art.

Based on the foregoing description, it will be apparent to those of skill in the art that the present invention provides an improved image separation mixer which employs fewer components than prior art image separation mixers. It will also be apparent that the present invention provides improved RF to LO signal isolation through the use of active components such as transistors for the mixing elements and the active power divider. Further, significant size reduction and easier integration into monolithic form is achieved through the use of an active power divider where the active devices of the power divider and the mixing elements are combined into single device structures so that impedance matching between the active devices is obtained without the use of additional matching elements.

While the present invention has been described in terms of particular arrangements, elements and methods, these are for convenience of explanation and not intended to be limiting. As those of skill in the art will understand based on the description herein, the present invention applies to other arrangements, choices of materials and elements and other methods which accomplish substantially the same result in substantially the same way, and it is intended to include in the claims that follow, these and other variations as will occur to those of skill in the art based on the present disclosure.

What is claimed is:

1. An image separating mixer apparatus comprising:
   a first phase shift circuit for receiving a first input signal of at least a first and second frequency, said first phase shift circuit providing separate first and second output signals;
   a signal division and amplification circuit for receiving a second input signal of at least a third frequency, said signal division and amplification circuit comprising first and second active amplification elements each receiving at inputs thereof a portion of said second input signal and having, respectively, first and second separated outputs providing, respectively, separated third and fourth output signals;
   a mixing circuit coupled between said first phase shift circuit and said signal division and amplification circuit, said mixing circuit having separated inputs for receiving, respectively, said first and second output signals from the first phase shift circuit for mixing with said separated third and fourth output signals from said signal division and amplification circuit to provide fifth and sixth separated output signals of a fourth frequency derived from said first and second input signals, said mixing circuit having first and second active mixing elements, wherein said active amplification elements and said active mixing elements are different devices with individual inputs; and
   a second phase shift circuit coupled to said mixing circuit for receiving said separated fifth and sixth output signals at separated inputs of said second phase shift circuit, said second phase shift circuit providing separated seventh and eight output signals of said fourth frequency corresponding, respectively, to said first and second frequencies.

2. An apparatus as claimed in claim 1 wherein said first and second active mixing elements are transistor devices.

3. An apparatus as claimed in claim 2 wherein said first and second active mixing elements and said first and second active amplification elements are field effect transistor, said field effect transistors each having a gate region, a source region and a drain region, and wherein the first and second amplification elements have a transconductance greater than that of the first and second mixing elements.

4. An apparatus according to claim 3 wherein said gate regions of said active mixing element are located individually between said sources and drains of said acting mixing elements and said gate regions of said active amplification elements are located individually between sources and drains of said active amplification elements and wherein said active mixing elements and said active amplification elements share common drains but have separate sources and individual gates.

5. An apparatus as claimed in claim 1 wherein said first phase shift circuit provides said first and second output signals of substantially equal amplitude and having a relative phase difference of substantially ninety degrees and, said signal division and amplification circuit provides said third and fourth output signals of substantially equal amplitude and having substantially zero relative phase difference.

6. An image separating mixer apparatus comprising:
   a first phase shift circuit for receiving a first input signal of at least a first and second frequency, said first phase shift circuit providing first and second output signals;
   a signal division and amplification circuit for receiving a second input signal of at least a third frequency, said signal division and amplification circuit providing third and fourth output signals, said signal division and amplification circuit having first and second active amplification elements;
   a mixing circuit coupled between said first phase shift circuit and said signal division and amplification circuit, said mixing circuit for mixing said first and second output signals from the first phase shift circuit with said third and fourth output signals from said signal division and amplification circuit to provide separated fifth and sixth output signals of a fourth frequency derived from said first and second input signals, said mixing circuit having first and second active mixing elements, wherein said first and second active mixing elements are transistor devices;
   a second phase shift circuit coupled to said mixing circuit for receiving said fifth and sixth output signals, said second phase shift circuit providing separated seventh and eighth output signals of said fourth frequency corresponding, respectively, to said first and second frequencies; and
   wherein said first active mixing element and said first active amplification element have different transconductances and comprise a first integrated device sharing a first output region and having separate input regions corresponding to said first active mixing element and said first active amplification element, respectively; and wherein said second active mixing element and said second active amplification element have different transconductances and comprise a second integrated device sharing a second output region and having separate input regions corresponding to said second active mixing element and said second active amplification element, respectively.

7. An apparatus as claimed in claim 6 wherein said seventh or eight output signal of said fourth frequency is higher in amplitude then said first input signal of said first or second frequency.

8. An image separating mixer apparatus comprising:
a first phase shift circuit for receiving a first input signal of at least a first and second frequency, said first phase shift circuit providing first and second output signals;
a signal division and amplification circuit for receiving a second input signal of at least a third frequency, said signal division and amplification circuit providing third and fourth output signals, said signal division and amplification circuit having first and second active amplification elements;
a mixing circuit coupled between said first phase shift circuit and said signal division and amplification circuit, said mixing circuit for mixing said first and second output signals from the first phase shift circuit with said third and fourth output signals from said signal division and amplification circuit to provide separated fifth and sixth output signals of a fourth frequency derived from said first and second input signals, said mixing circuit having first and second active mixing elements, wherein said first and second active mixing elements and said first and second active amplification elements are field effect transistors, said field effect transistors each having a gate region, a source region and a drain region;
a second phase shift circuit coupled to said mixing circuit for receiving said fifth and sixth output signals, said second phase shift circuit providing separated seventh and eighth output signals of said fourth frequency corresponding, respectively, to said first and second frequencies; and
wherein said first active mixing element and said first active amplification element have different transconductances and comprise a first integrated device sharing a first drain region, said first integrated device having separate gates regions corresponding to said first active mixing element and said first active amplification element, respectively; and
wherein said second active mixing element and said second active amplification element have different transconductances and comprise a second integrated device sharing a second drain region, said second integrated device having separate gate regions corresponding to said second active mixing element and said second active amplification element, respectively.

9. An apparatus as claimed in claim 8 wherein:
said separate gate regions of said first integrated device are separately coupled to separate bias voltage nodes for said first active mixer element and said first active amplification element; and
said separate gate regions of said second integrated device are separately coupled to said separate bias voltage nodes for said second active mixer element and said second active amplification element.

10. An apparatus as claimed in claim 8 wherein said first and second active amplification elements have a gate width of a least twice that of said first and second active mixing elements.

11. An apparatus as claimed in claim 8 wherein said first and second active mixing elements are in plan view substantially identical or mirror images of each other, and said first and second active amplification elements are in plan view substantially identical or mirror images of each other, said active mixing elements and said active amplification elements being fabricated from the same semiconductor die, and first and second active amplification elements have transconductances greater than transconductances of the first and second active mixing elements.

12. An image separating mixer apparatus comprising:
a first phase shift circuit for receiving a first input signal of at least a first and second frequency, said first phase shift circuit providing first and second output signals;
a signal division and amplification circuit for receiving a second input signal of at least a third frequency, said Signal division and amplification circuit providing third and fourth output signals, said signal division and amplification circuit having first and second active amplification elements;
a mixing circuit coupled between said first phase shift circuit and said signal division and amplification circuit, said mixing circuit for mixing said first and second output signals from the first phase shift circuit with said third and fourth output signals from said signal division and amplification circuit to provide separated fifth and sixth output signals of a fourth frequency derived from said first and second input signals, said mixing circuit having first and second active mixing elements, and;
a second phase shift circuit coupled to said mixing circuit for receiving said fifth and sixth output signals, said second phase shift circuit providing separated seventh and eighth output signals of said fourth frequency corresponding, respectively, to said first and second frequencies; and
further comprising a filter circuit coupling said mixing circuit to said second phase shift circuit, said filter circuit having a pass-band including said fourth frequency and a stop band including at least one of said first, second or third frequencies.

13. An apparatus as claimed in claim 12 wherein said filter circuit comprises a first filter circuit for passing said fifth output signal and a second filter circuit for passing said sixth output signal.

14. A method for mixing an RF input signal of a first and second frequency with a LO input signal of at least a third frequency to produce an output IF signal of a fourth frequency having first and second separated components corresponding to said first and second RF frequencies, respectively, comprising:
coupling said RF input signal to a first phase shift circuit which provides first and second RF output signals;
coupling said LO input signal to a signal division and amplification circuit having first and second active amplification elements having outputs which provide first and second LO output signals;
supplying said first RF output signal and said first LO output signal to a first-active mixing element;
supplying said second RF output signal and said second LO output signal to a second active mixing element separate from said first active mixing element;

separately coupling first and second intermediate IF signals appearing at separated outputs of said separate first and second active mixing elements to different inputs of a second phase shift circuit; and obtaining from said second phase shift circuit, said first and second separated components of said output IF signals corresponding to said first and second RF frequencies, respectively.

15. A method as claimed in claim 14 wherein said second coupling step further comprises coupling said LO input signal to a signal division and amplification circuit having first and second active amplification elements which provide a first LO output signal to a first output region of said first amplification element and a second output LO signal to a second output region of said second amplification element;

said first supplying step further comprises supplying said first RF output signal and said first LO output signal to a first active mixing element, said first active mixing element having an output region in common with said first output region; and said second supplying step further comprises supplying said second RF output signal and said second LO output signal to a second active mixing element, said second active mixing element having an output region in common with said second output region.

16. A method as claimed in claim 15 wherein said supplying steps further comprise supplying said RF output signals to field effect transistors, wherein said input node corresponds with a gate region, said output node corresponds to a drain region and said reference node corresponds to a source region; and said second coupling step further comprises coupling said LO input signal to field effect transistors, wherein said input node corresponds with a gate region, said output node corresponds to a drain region and said reference node corresponds to a source region; and wherein said steps of supplying said RF signals and coupling said LO input signals comprise supplying and coupling said signals to different gates of different transistors.

17. A method as claimed in claim 16 wherein said supplying steps comprise supplying said RF and LO output signals to metal enhanced semiconductor field effect transistors (MES-FETs) having different transconductances.

18. The method as claimed in claim 16 wherein said coupling step further comprises coupling said LO input signal to substantially identical active amplification elements and said supplying step further comprises supplying said RF and LO output signals to substantially identical active mixing elements, said active mixing elements and said active amplification elements being fabricated from a single semiconductor die, said amplification elements and said active mixing elements having different transconductances.

19. A method as claimed in claim 15 wherein said supplying steps further comprise supplying said RF output signals to a first pair of field effect transistors; and said second coupling step further comprises coupling said LO input signal to a second pair of field effect transistors, said second pair of field effect transistors having a transconductance of at least twice that of said first pair of field effect transistors.

20. A method as claimed in claim 14 wherein said second coupling step further comprises coupling said LO input signal to a first input region of a first integrated device and a first input region of a second integrated device, said first supplying step further comprises supplying said first RF output signal to a second input region of said first integrated device and supplying said first LO output signal to an output region of said first integrated device;

said second supplying step further comprises supplying said second RF output signal to a second input region of said second integrated device and supplying said second LO output signal to an output region of said second integrated device;

said third coupling step further comprises coupling said intermediate IF signals from said output regions of said integrated devices to said second phase shift circuit.

21. A method as claimed in claim 20 wherein said supplying steps further comprises supplying said first and second LO output signals to said first and second active mixing elements without any intermediate matching elements between said active amplification element and said active mixing elements.

22. A method as claimed in claim 14 further comprising coupling said first and second intermediate IF signals to said second phase shift circuit through filters which have pass bands including the IF frequencies and stop bands including the RF or LO frequencies or both.

23. A method as claimed in claim 14 further comprising: coupling said separate input regions of said first integrated device to separate bias voltages for said first active mixer element and said first active amplification element; and coupling said separate input regions of said second integrated device to said separate bias voltaged for said second active mixer element and said second active amplification element.

24. A method as claimed in claim 14 wherein said supplying steps further comprises:

supplying said first and second RF output signals having substantially equal amplitude and having a relative phase difference of substantially ninety degrees; and supplying said first and second LO output signals of substantially equal amplitude and having substantially zero relative phase difference.

25. A method of separating image signals created from mixing an LO input signal of a first frequency with an RF input signal of at least a second and third frequency comprising:

dividing said RF input signal into first and second substantially identical RF output signals having a relative phase difference of substantially ninety degrees;

dividing and amplifying said LO input signal into two substantially identical LO output signals having a relative phase difference of substantially zero degrees, said two substantially identical LO output signals appearing, respectively, at first and second separated output regions of first and second transistors;

providing said RF output signals to input regions of active mixing elements, said active mixing elements comprising third and fourth transistors having third and fourth separated output regions in common, respectively, with said first and second output regions, wherein said first and third output regions form a first common region, and said second and said fourth output regions form a second common region; and combining separate intermediate IF signals appearing, respectively, at said first and second common regions to produce separated IF output signals of said fourth frequency corresponding to said second and third frequencies of said RF input signal.

* * * * *